United States Patent
Bezama et al.

[11] Patent Number: 6,117,367
[45] Date of Patent: Sep. 12, 2000

[54] PASTES FOR IMPROVED SUBSTRATE DIMENSIONAL CONTROL

[75] Inventors: Raschid J. Bezama, Mahopac, N.Y.; Michael A. Cohn, Ramsey, N.J.; Benjamin V. Fasano, New Windsor, N.Y.; Gregory M. Johnson, Poughkeepsie, N.Y.; Robert A. Rita, Wappingers Falls, N.Y.; Rao V. Vallabhaneni, Hopewell Junction, N.Y.; Nancy A. Wier-Cavalieri, Highland, N.Y.

[73] Assignee: International Business Machines Corporation, Armonk, N.Y.

[21] Appl. No.: 09/021,045

[22] Filed: Feb. 9, 1998

[51] Int. Cl.$^7$ ................................ H01B 1/02; H01C 1/02
[52] U.S. Cl. ................................ 252/514; 252/515
[58] Field of Search ................................ 252/514, 515

[56] References Cited

U.S. PATENT DOCUMENTS

| | | |
|---|---|---|
| 4,817,276 | 4/1989 | Toda et al. . |
| 4,827,083 | 5/1989 | Inasaka et al. . |
| 4,835,039 | 5/1989 | Barringer et al. . |
| 4,859,835 | 8/1989 | Balderson . |
| 4,861,646 | 8/1989 | Barringer et al. . |
| 5,114,642 | 5/1992 | Jung . |
| 5,176,853 | 1/1993 | Sarma et al. . |
| 5,250,228 | 10/1993 | Baigrie et al. . |
| 5,336,444 | 8/1994 | Casey et al. . |
| 5,363,271 | 11/1994 | Pepin . |
| 5,468,445 | 11/1995 | Casey et al. . |
| 5,475,048 | 12/1995 | Jamison et al. . |
| 5,496,619 | 3/1996 | Itagaki et al. . |
| 5,514,451 | 5/1996 | Kumar et al. . |
| 5,525,402 | 6/1996 | Nakamura et al. . |
| 5,547,530 | 8/1996 | Nakamura et al. . |
| 5,951,918 | 9/1999 | Kuwajima et al. . |

*Primary Examiner*—David E. Graybill
*Attorney, Agent, or Firm*—Ratner & Prestia; Tiffany L. Townsend

[57] ABSTRACT

Metal pastes used in the fabrication of multilayer ceramic (MLC) substrates used in semiconductor devices. The pastes reduce substrate defects, such as via bulge and camber. The pastes are comprised of a metal having high conductivity, frit which includes glass, an organic binder, and a solvent, optionally with a surfactant.

10 Claims, 10 Drawing Sheets

| PASTE CODE | MO SIZE | PASTE LOT | ALUMINA + FRIT (VOL % SOLIDS) | FRIT/ALUMINA RATIO (VOL % VOL%) | FRIT FRACTION (NON-METALLIC SOLIDS) | VIA BULGE (MICRONS) | CAMBER (MICRONS) |
|---|---|---|---|---|---|---|---|
| A1 | 2.8 | 1 | 0 | 0/0 | 0.00 | 35 | |
| A2 | 2.8 | 1 | 12 | 0/100 | 0.00 | 29 | |
| A3 | 2.8 | 1 | 12 | 15/85 | 0.15 | 29 | |
| A4 | 2.8 | 1 | 12 | 30/70 | 0.30 | 26 | |
| A5 | 2.8 | 1 | 12 | 100/0 | 1.00 | 25 | |
| A6 | 2.8 | 1 | 23 | 0/100 | 0.00 | 22 | |
| A7 | 2.8 | 1 | 23 | 15/85 | 0.15 | 21 | |
| A8 | 2.8 | 1 | 23 | 30/70 | 0.30 | 18 | 190 |
| A9 | 2.8 | 1 | 23 | 100/0 | 1.00 | 16 | 40 |
| B1 | 2.55 | 1 | 0 | 0/0 | 0.00 | 37 | |
| B2 | 2.55 | 1 | 12 | 0/100 | 0.00 | 26 | |
| B3 | 2.55 | 1 | 12 | 15/85 | 0.15 | 24 | |
| B4 | 2.55 | 1 | 12 | 30/70 | 0.30 | 28 | |
| B5 | 2.55 | 1 | 12 | 100/0 | 1.00 | 17 | |
| B6 | 2.55 | 1 | 23 | 0/100 | 0.00 | 25 | |
| B7 | 2.55 | 1 | 23 | 15/85 | 0.15 | 20 | |
| B8 | 2.55 | 1 | 23 | 30/70 | 0.30 | 19 | 370 |
| B9 | 2.55 | 1 | 23 | 100/0 | 1.00 | 14 | 60 |
| C7 | 2.55 | 2 | 23 | 15/85 | 0.15 | 15 | 70 |
| C8 | 2.55 | 2 | 23 | 30/70 | 0.30 | 15 | 50 |
| C9 | 2.55 | 2 | 23 | 100/0 | 1.00 | 7 | −180 |
| D | 2.55 | 3 | 12 | 15/85 | 0.15 | 31 | 950 |
| E | 2.55 | 4 | 0 | 0/0 | 0.00 | 26 | 400 |
| H | 2.55 | 5 | 23 | 15/85 | 0.15 | 46 | 1150 |

NOTE: FRIT = POWDERED GLASS

| PASTE CODE | MO SIZE | PASTE LOT | ALUMINA + FRIT (VOL % SOLIDS) | FRIT/ALUMINA RATIO (VOL % VOL%) | FRIT FRACTION (NON-METALLIC SOLIDS) | VIA BULGE (MICRONS) | CAMBER (MICRONS) |
|---|---|---|---|---|---|---|---|
| A1 | 2.8 | 1 | 0 | 0/0 | 0.00 | 35 | |
| A2 | 2.8 | 1 | 12 | 0/100 | 0.00 | 29 | |
| A3 | 2.8 | 1 | 12 | 15/85 | 0.15 | 29 | |
| A4 | 2.8 | 1 | 12 | 30/70 | 0.30 | 26 | |
| A5 | 2.8 | 1 | 12 | 100/0 | 1.00 | 25 | |
| A6 | 2.8 | 1 | 23 | 0/100 | 0.00 | 22 | |
| A7 | 2.8 | 1 | 23 | 15/85 | 0.15 | 21 | 190 |
| A8 | 2.8 | 1 | 23 | 30/70 | 0.30 | 18 | 40 |
| A9 | 2.8 | 1 | 23 | 100/0 | 1.00 | 16 | |
| B1 | 2.55 | 1 | 0 | 0/0 | 0.00 | 37 | |
| B2 | 2.55 | 1 | 12 | 0/100 | 0.00 | 26 | |
| B3 | 2.55 | 1 | 12 | 15/85 | 0.15 | 24 | |
| B4 | 2.55 | 1 | 12 | 30/70 | 0.30 | 28 | |
| B5 | 2.55 | 1 | 12 | 100/0 | 1.00 | 17 | |
| B6 | 2.55 | 1 | 23 | 0/100 | 0.00 | 25 | |
| B7 | 2.55 | 1 | 23 | 15/85 | 0.15 | 20 | 370 |
| B8 | 2.55 | 1 | 23 | 30/70 | 0.30 | 19 | 60 |
| B9 | 2.55 | 1 | 23 | 100/0 | 1.00 | 14 | |
| C7 | 2.55 | 2 | 23 | 15/85 | 0.15 | 15 | 70 |
| C8 | 2.55 | 2 | 23 | 30/70 | 0.30 | 15 | 50 |
| C9 | 2.55 | 2 | 23 | 100/0 | 1.00 | 7 | −180 |
| D | 2.55 | 3 | 12 | 15/85 | 0.15 | 31 | 950 |
| E | 2.55 | 4 | 0 | 0/0 | 0.00 | 26 | 400 |
| H | 2.55 | 5 | 23 | 15/85 | 0.15 | 46 | 1150 |

NOTE: FRIT = POWDERED GLASS

FIG. 6

| PASTE CODE | MO SIZE | PASTE LOT | % TOTAL INORGANIC (CERAMIC + FRIT) (VOL % SOLIDS) | FRIT/ALUMINA RATIO (VOL % VOL%) | FRIT FRACTION (NON-METALLIC SOLIDS) | VIA BULGE (MICRONS) | CAMBER (MICRONS) |
|---|---|---|---|---|---|---|---|
| E | 2.55 | 6 | 0 | 0/0 | 0.00 | 44 | -270 |
| D | 2.55 | 7 | 12 | 15/85 | 0.15 | 55 | -230 |
| H | 2.55 | 8 | 23 | 15/85 | 0.15 | 73 | -120 |
| B5 | 2.55 | 1 | 12 | 100/0 | 1.00 | 34 | -60 |
| B9 | 2.55 | 1 | 23 | 100/0 | 1.00 | 13 | -80 |

FIG. 7

PASTES FOR IMPROVED SUBSTRATE DIMENSIONAL CONTROL

TECHNICAL FIELD

The present invention relates generally to the metal pastes used in the fabrication of multilayer ceramic (MLC) substrates incorporated in packaging semiconductor devices. More particularly, the present invention relates to the pastes used in the fabrication of integrated circuit packages.

BACKGROUND OF THE INVENTION

Ceramic structures, usually and preferably multilayered, are used in the production of electronic substrates and devices. Multilayer ceramic substrates may comprise patterned metal layers which act as electrical conductors sandwiched between ceramic layers which act as insulators. The substrates may have termination pads for attachment to semiconductor chips, such as those for Controlled Collapse Chip Connection (C4), connector leads, capacitors, resistors, covers, or other device elements. C4 is also known as "solder bump" and "flip chip." Interconnection between conductive layers, which are separated by insulating layers, can be made through vias which are formed by filling holes in the insulating layers with a conductive metal paste.

Generally, ceramic layers are formed from ceramic green sheets which are prepared by mixing a ceramic particulate, a thermoplastic polymeric binder, plasticizers, and solvents. This mixture is spread or cast into ceramic sheets from which solvents are subsequently volatilized to provide coherent, self-supporting, flexible green sheets. After blanking, punching holes to act as vias, screening features with conductive/metallizing paste, stacking the green sheets, and laminating the green sheets to form a laminant, the green sheets are eventually fired at temperatures sufficient to drive off the polymeric binder resin and to sinter the ceramic particulates together into a densified ceramic substrate. Also, during the course of firing, the metallization paste features used to fill vias for interlayer connection and XY wiring are consolidated to form electrical conductors. The fired ceramic substrate also has surface metal features that provide electrical connection to the buried wiring within the substrate. These sheets may contain conducting (metal) lines. The sheets which are laminated together include holes within their surfaces to form the vias which allow electrical connections through the layer from the substrate to the chip.

The vias which are filled with a metal paste form metal columns perpendicular to the plane of the substrate once the components of these layers are fired to sinter the metal paste and ceramic into a monolithic. The result is a mechanically strong part with the desired electrical properties. After the monolithic is formed, the substrate may be attached to a semiconductor device such as the chip. C4 technology offers an advanced microelectronic chip packaging and connection technique over typical wire bond interconnection.

The basic idea of C4 is to connect chips, chip packages, or such other units by placing solder balls between two metallized surfaces of the units. These tiny balls of electrically conductive solder bridge the gaps between respective pairs of metal pads on the units being connected. Each pad to be connected has a corresponding pad on the surface of the other unit so that the pad arrangements are mirror images. As the units are aligned and exposed to temperatures above the melting point of the solder, the solder balls on the pads of the first unit become molten and join to corresponding conductive pads (having no solder balls) on the second unit, making permanent connections between respective pads.

A major application of C4 is in joining semiconductor devices (integrated circuits) to chip carriers. The C4 balls are typically placed on the chips while they are still in wafer form before dicing.

C4 allows a very high density of electrical interconnections. Unlike earlier techniques which made connections around the perimeter of a chip or a chip package, C4 allows one or more surfaces of a chip or package to be packed with pads. The maximum number of interconnections increases with the square of the chip size when using C4 arrays, while the maximum number of perimeter connections increases only linearly with the die size. Because the C4 balls can be made quite small, typically a few thousandths of an inch in diameter, the surface density of C4 connections can be on the order of thousands per square inch.

In general, the metal pastes used in fabricating multilayer ceramic (MLC) substrates for connection to C4 or other types of chips are comprised of metals with high melting points, such as molybdenum, tungsten, and gold. In addition, these pastes may use a metal which is less costly and has low electrical resistance, such as copper or its alloys. The paste also may include metal particles, an organic binder, solvents, plasticizers, and flow control agents.

Additives consisting of small amounts of powdered glass or ceramic particles (known as "frit") have been added to pastes in order to improve adhesiveness in certain non-C4 chip types. Normally, only about 5% or less frit, with about 10% being the highest amount usually added, is used in these compositions so that the highest possible electrical conductivity is maintained.

The paste will not shrink during sintering to the same extent or at the same rate as the ceramic component. When the respective shrinkages of the metal portion and ceramic portion are not "matched" appropriately, significant dimensional distortions can result in the fired ceramic/metal package. These can take the form of "via bulge," "camber," and other dimensional irregularities.

"Via bulge" is an out of flat condition of the top surfaces of the C4 vias. Large values of via bulge can make C4 or other types of chip attach difficult or impossible. "Camber," as referred to in this document, is any out-of-flat condition in the x-y plane. This may comprise a simple spherical or parabolic curvature, or a more convoluted configuration.

These defects on the surface of the substrate are undesirable because substantially "flat" substrates are required for practical substrate applications. Although the effects of these dimensional distortions are related to the overall sintering shrinkage of the several materials in the package, and ideally a perfect match might be expected to be desirable, in practice, a less-than-perfect match is frequently acceptable. Furthermore, the shrinkage in the package may, in fact, be an interactive process following a course different than expected from the shrinkage of the individual components fired separately or independently.

Unacceptable levels of via bulge or camber can prevent proper connection of device components and cause the device to be defective. In the case where camber is present, the substrate may be flattened by refiring. Other attempts to reduce the shrinkage difference of the metal and ceramic include controlling the metal particle size or introducing additives into the paste.

Nevertheless, these attempts at reducing mismatched shrinkage have been unsuccessful because via conductivity and bonding of the metal to the dielectric have suffered. In the case where via bulge is present, refiring may not be used, and the substrate may have to be rejected. Thus, these attempts at solving this problem have increased manufacturing cost, decreased yield, and caused other device defects.

The deficiencies of the conventional pastes show that a need still exists for a paste that will improve substrate dimensional control.

SUMMARY OF THE INVENTION

To meet this and other needs, and in view of its purposes, the present invention provides an improved paste for electrically interconnecting layers in ceramic substrate applications. The present invention is especially applicable to pastes used in the formation of multilayer ceramic (MLC) substrates used in C4 semiconductor devices. The paste of the present invention comprises a metal of high conductivity, a non-metallic inorganic phase (frit and ceramic), a solvent having a high boiling point, an organic binder, optionally a surfactant, and a modifier phase, such as a rheology modifier, for controlling the viscosity of the paste.

The metal in the paste of the present invention may be molybdenum, tungsten, copper, nickel, silver, gold, platinum, or palladium, among others. Also, the paste may contain a metal alloy of those metals. The organic binder may be ethyl cellulose, polyvinyl alcohol, or polyvinyl butyrol. The solvent may be pine oil, terpineol, 2,2,4-trimethyl-1,3-pentanediol isobutyrate (referred to as texanol® of Eastmann Kodak), or butyl carbitol acetate. The paste may additionally include alumina or other ceramic and frit.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 6 is a table showing via bulge for pastes formulated with various inorganic contents and glass fractions;

FIG. 7 is a table showing via bulge for pastes formulated with various inorganic components and glass fractions;

DETAILED DESCRIPTION OF THE INVENTION

Figure 1A:
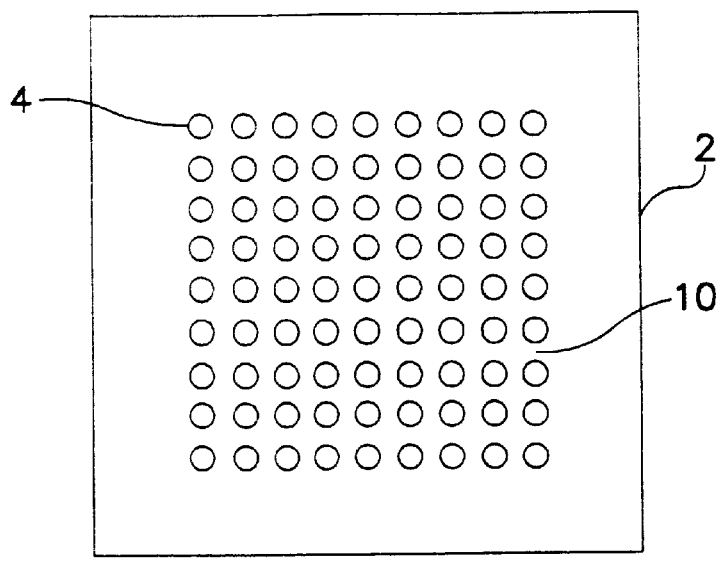
FIG. 1A is a top view of a MLC substrate.

Improved substrate dimensional control (i.e. reduced "via bulge," "camber," and other distortions) can be achieved by incorporating appropriate levels of glass, usually ground glass which is referred to as frit, into the paste formulation. Specifically, the glass level used in pastes of the present invention is higher in terms of relative volume percentage of solids than for previously used pastes.

For pastes normally formulated without any non-metallic inorganic additives, any glass additions will tend to improve the sintered dimensions, and greater improvement in dimensional control is usually achieved with greater amounts of glass. For pastes formulated with ceramic additives but no glass, any glass addition will result in an improvement.

Similarly, for pastes formulated with additions of both glass and ceramic, higher glass levels (e.g., a higher proportion of glass than found in the substrate) will result in improvement. This works for Mo-based pastes when used with ceramic or alumina/glass composite substrate materials. When practiced in an appropriate manner, it is possible to produce pastes that reduce "via bulge" and "camber" without significantly degrading the electrical or mechanical properties of the paste.

As indicated above, in the past, the glass component, glass plus ceramic additions, or both have been used to modify the properties of metal pastes. In hybrid substrate applications (pastes applied to previously fired substrates), the amount of glass added is usually small. The glass is usually added to promote adhesion, and the composition is frequently very different from the substrate or any glass phase in the substrate.

For MLC applications, if material is added to the metal paste, it is usually the same material that is used to formulate the substrate. These additions would be in the same or similar proportions if the substrate is comprised of several components. In the pastes of the present invention, in which the paste will be added before the substrate has been fired, the glass is present at a relatively high level and, when added in combination with a ceramic component, the percentage of glass relative to the ceramic is greater than that used in the substrate. Although it is frequently preferred to use the same glass formulation in the metal paste as is used in the "ceramic" part of the substrate, it is not a requirement.

In addition to molybdenum, other metals may be used in the paste. These include tungsten, copper, nickel, silver, gold, platinum, palladium, and others. Alumina may also be incorporated into the paste. The paste also comprises a high boiling point solvent which may be pine oil, terpineol, 2,2,4-trimethyl-1,3-pentanediol isobutyrate, butyl carbitol acetate, and others. The paste further comprises an organic binder which may include ethyl cellulose, polyvinyl alcohol, polyvinyl butyrol, and others. In addition, surfactants may be used in the paste formulation.

The paste of the present invention may be used in fabricating varied multilayer ceramic substrates. The insulating part of the substrate may be formulated using a high temperature cofired ceramic (HTCC) (using a temperature above about 1100° C.) using materials such as alumina, aluminum nitride, mullite, beryllia, or others. Appropriate sintering aids such as glasses or other substances, may be used. The conductive elements/components (vias, signal lines, voltage planes, I/O pads, etc.) of the substrate are formulated from conductor pastes where the metal portion is selected from molybdenum, tungsten, nickel, platinum, palladium and alloys containing these metals.

Alternatively the insulating part of the substrate may be formulated using a low temperature cofired ceramic (LTCC) (using a temperature below about 1100° C.) using materials such as glass, glass-ceramic, or glass plus ceramic. The conductive elements/components (vias, signal lines, voltage planes, I/O pads, etc.) of the substrate are formulated from conductor pastes where the metal portion is selected from copper, nickel, silver, gold, and alloys containing these metals. In both types of cofired ceramic insulating portions, C4 or a similar technology may be used to attach a semiconductor device to the surface of the semiconductor substrate and the paste of the present invention is used to prepare at least a portion of the conductors.

EXAMPLES OF THE INVENTION

In the following examples, test vehicles were primarily used to evaluate the relative behavior of metal (molybdenum (Mo)-containing) pastes having various inorganic formulations. These test vehicle substrates were designed to exaggerate the effects of substrate distortions, specifically via bulge and camber. As indicated above, these effects arise from the shrinkage mismatch between the substrate material and the metal pastes. In all cases, the substrate material was comprised of a mixture of alumina, ceramic, and a frit (alkaline earth aluminosilicate) (i.e., powdered glass). The ceramic green sheet was prepared by tape casting sheets and laminating them together after metallization. Tape casting was accomplished by the doctor blading of a (paint-like) slurry prepared from the alumina and glass powders combined with solvents and binders. After drying and solvent removal, a somewhat pliable "plastic" sheet, filled with the particles, results.

The metal pastes were prepared by mixing Mo powders and inorganic additives (alumina, frit, etc.) with an organic vehicle comprised of a high boiling point solvent, an organic binder, and surfactants. The laminated parts were fired by heating to about 1500–1650° C. under atmosphere conditions that prevent the oxidation of the Mo metal, but allow oxidation of the organic components.

Figure 1B:
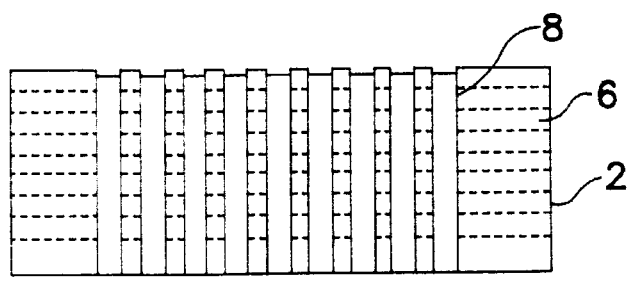
FIG. 1B is a cross-sectional view of a MLC substrate.
Figure 1C:
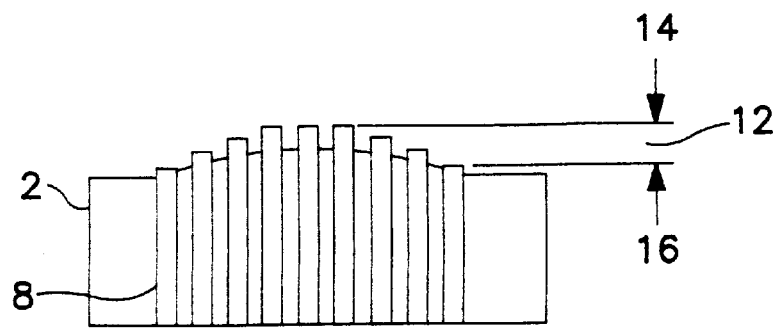
FIG. 1C is a side view of a MLC substrate displaying via bulge.

The substrate used to test for via bulge, as shown in FIGS. 1A through 1C, was comprised of twenty identical layers of ceramic green sheets 6 that were punched with holes in an identical pattern approximating a chip site grid 10. This grid 10 is typically used for C4 substrate-to-chip solder attachment. The grid 10 was comprised of vias 4 having a diameter of approximately 4 mils (1 mil=0.001 inches=0.0254 millimeters) (0.1016 mm) that were spaced on approximately 9 mil (0.225 mm) centers. Because all layers were identical, the vias 4 combine to form a matrix of metal columns 8 that span the entire thickness of the first substrate 2. Any mismatch in the shrinkage (rate or extent) between the metal paste and the substrate material will produce a height difference between the substrate material at the edge of the chip site and the height at the center of the chip site. For the materials used in these examples, the substrate material generally shrinks more than the metal paste during sintering, so the center of the site is generally higher than the edge.

This distortion of the metallized ceramic substrate, shown in FIG. 1C, is referred to as via bulge 12, and is usually characterized as the difference between the height of the tallest via 14 (typically in the middle) and the height of the shortest via 16 (typically at the edge). Such a characterization is a measure of the ability to solder chips to the substrate (in C4), because a via bulge which is too large will result in some connections not being properly made, yielding a defective part. The fired substrates were about 50 mm square, having a centralized chip site of about 20 mm square.

Figure 3A:
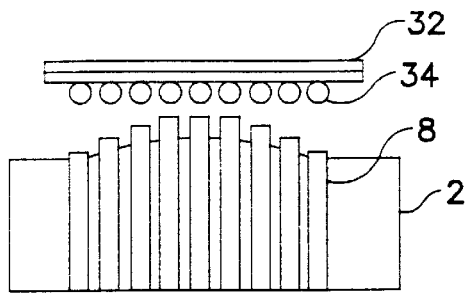
FIG. 3A is a side view of a C4 chip and a MLC substrate displaying via bulge.
Figure 3B:
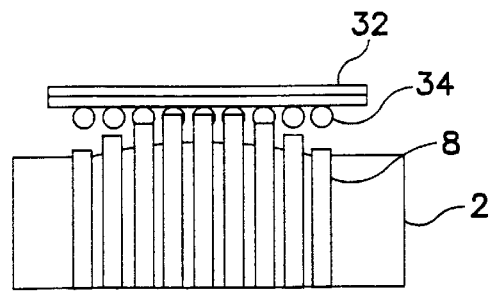
FIG. 3B is a side view of a C4 chip partially connected to a MLC substrate displaying via bulge.
Figure 5:
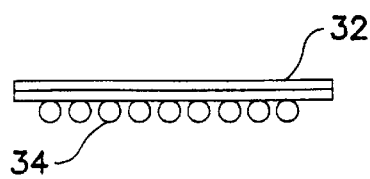
FIG. 5 is a side view of a C4 chip.

FIG. 5 shows a C4 chip 32 with solder balls 34 attached to the chip for connecting to a substrate. FIGS. 3A and 3B show a substrate 2 formed using conventional pastes, having significant differences in the height of the metal columns 8, and their relation to the C4 chip 32. Specifically, FIG. 3B shows the metal columns 8 of the substrate 2 being positioned in contact with the C4 chip 32. The via bulge (height differential) of the columns prevents a proper connection with the C4 balls 34. Therefore, a defective device is produced.

Figure 4A:
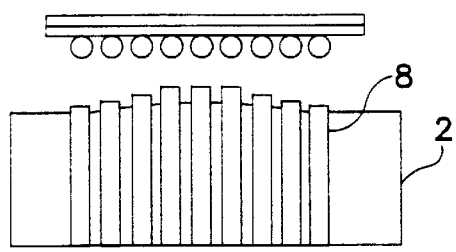
FIG. 4A is a side view of a C4 chip and a MLC substrate displaying substantially reduced via bulge.
Figure 4B:
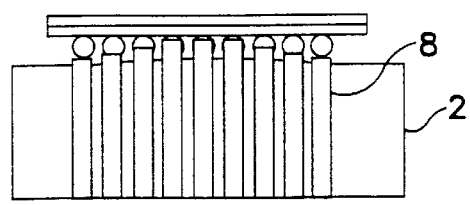
FIG. 4B is a side view of a C4 chip connected to a MLC substrate.

In contrast, FIGS. 4A and 4B show a substrate 2 formed using the pastes of the present invention in which the via bulge is significantly reduced. The metal columns 8 are able to form a proper connection with the C4 balls 34 of the chip 32 and, thus, this device does not have the defects common in the prior art.

Figure 2A:
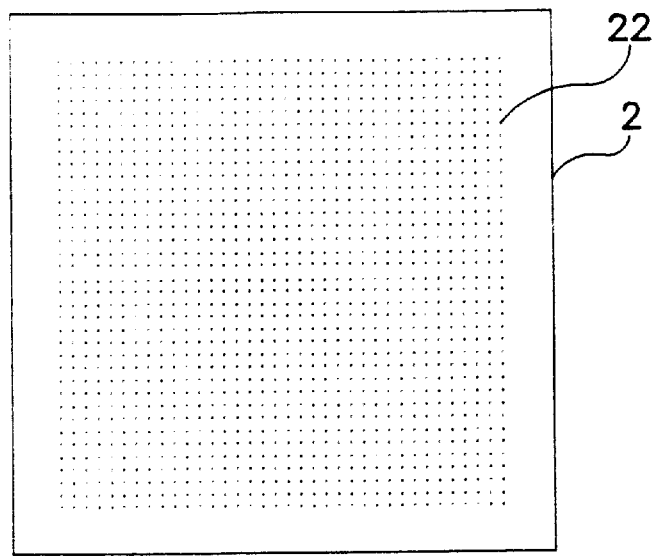
FIG. 2A is a top view of a MLC substrate.
Figure 2B:
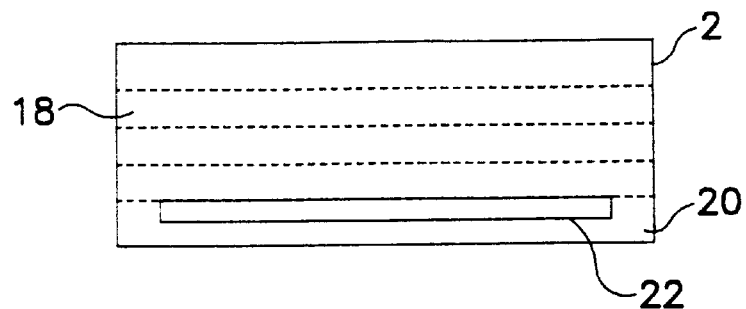
FIG. 2B is a cross-sectional view of a MLC substrate.
Figure 2C:
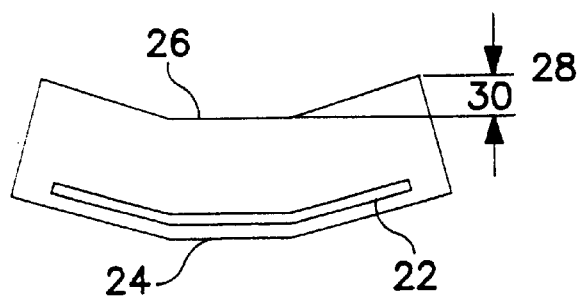
FIG. 2C is a side view of a MLC substrate displaying camber.

The camber test vehicle, as shown in FIGS. 2A through 2C, was comprised of five ceramic layers 18. Four of the layers were blank or unmetallized; the fifth layer 20 had a solid metal layer 22 screened upon one surface. When the five sheets are laminated together, the metallized layer is placed on the bottom of the stack, with the metallized side pointing toward the substrate center. The laminated parts were fired like those above, typically with the metal layer at the bottom of the part.

If the metal and ceramic shrinkages are not matched, the substrate will distort (will be cambered), because the bottom surface 24 will shrink differently than the top surface 26. If the metal shrinks less than the ceramic, and the metallized layer is down (at the bottom of the substrate), the fired substrate will curl as shown in FIG. 2C, with the edges 28 pointing upward. This effect is what is referred to as camber 30.

This curvature can be simple and ideally approximate a sphere or parabola, or it can be quite complex. The test vehicle described in this document tended to have the more simple curvatures. These substrates are also about 50 mm square after firing. Substrates with large camber cannot be used to construct electronic components.

It should be noted that the shrinkage of the ceramic substrate generally varies with the orientation of geometric direction. That is, the shrinkage in the (x-y) plane of the laminated sheets is different than in the direction (z) perpendicular to that plane. The metal shrinkage (for a given inorganic formulation) depends upon the relative particle density after screening and drying, which tends to be more uniform. Shrinkage comparisons should account for this, and should realize that when materials having different shrinkages are in contact with each other, their shrinkages can differ from that when they are independent of one another.

For the latter case, the low shrinkage material will tend to impede the shrinkage of the high shrinkage material and, conversely, the high shrinkage material will tend to increase the shrinkage of the low shrinkage material. The relative amounts of each and the geometry of their relative placement will also be factors. The above test vehicles are believed, therefore, to be the best measure of the effective behavior of the materials in real substrates, and are preferred to comparing the shrinkage of samples of the materials fired independent of each other (i.e., in typical furnace cycles or dilatometers). Although the latter data are useful for evaluating large numbers of similar materials and for fundamental understanding, their results can be misleading with regard to the behavior of the materials in actual substrates designed to be used in real electronic components.

Example 1

A number of molybdenum (Mo)-containing conductor pastes were formulated and the inorganic, non-metallic additions were selectively varied. These are listed in FIG. 6 as pastes A1–A9, B1–B9, C7–C9, D, E, and H. The organic vehicle and the total volume percentage of solids are constant for all pastes. Half of the pastes were prepared with Mo powder having a Mo particle size (FSSS=Fisher sub sieve size) of 2.8 and half were prepared with powder having a particle size of 2.55. The surface area and other properties also are different for the two powder lots.

Within each group, non-metallic additives were present at 0, 12, and 23% of the volume percentage of the total solids content. In these experiments, the total of metal volume+ alumina volume+frit volume=100%. (The volume referred to in this document is the sum of the volume of the individual particles, and not the occupied volume. Also, volume=[total weight of particles]/[material density for the particles] which is the volume the particles would occupy if they fully densified to zero porosity.) The ratio of ceramic to frit was also varied systematically. Thus, paste A1 has a solids content comprised of 100% (volume) 2.8 Mo; paste A2 has a solids content of 88% Mo and 12% alumina; and paste A4 has a solids content of 88% Mo, 8.4% alumina, and 3.6% frit; and paste A5 has a solids content of 88% Mo and 12% frit. The compositions of the other pastes can be similarly identified.

Substrates tested for via bulge, as shown in FIGS. 1A through 1C, were prepared using these pastes. The ceramic used in the green sheets was comprised of a volume of 85% alumina and 15% frit. The frit in the green sheets had the same chemical composition as that used in the pastes. The alumina is of the same type in both pastes and green sheets (prepared under similar conditions, but from different lots).

Figure 8:
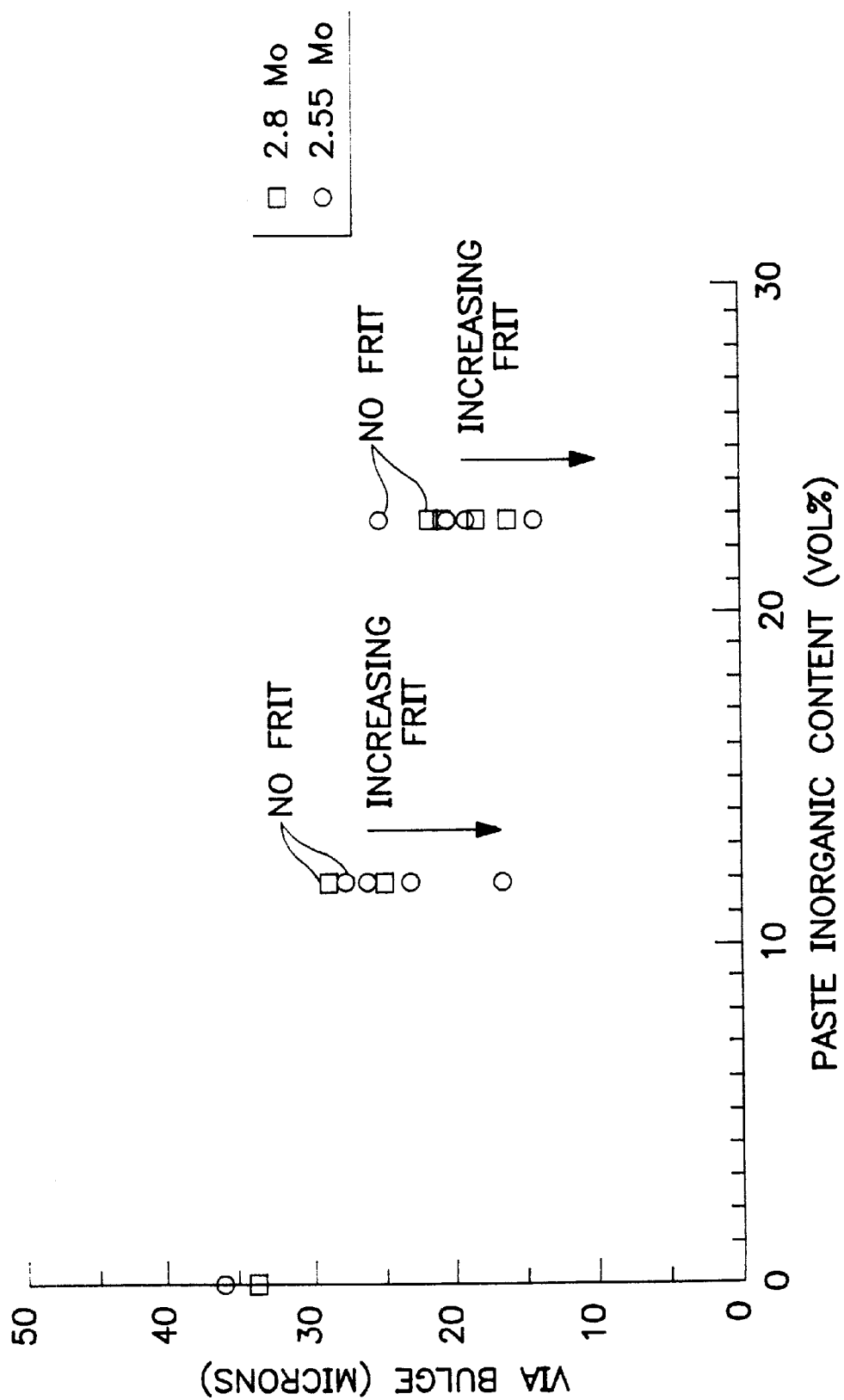
FIG. 8 is a graph of via bulge versus the inorganic content of the paste.
Figure 9:
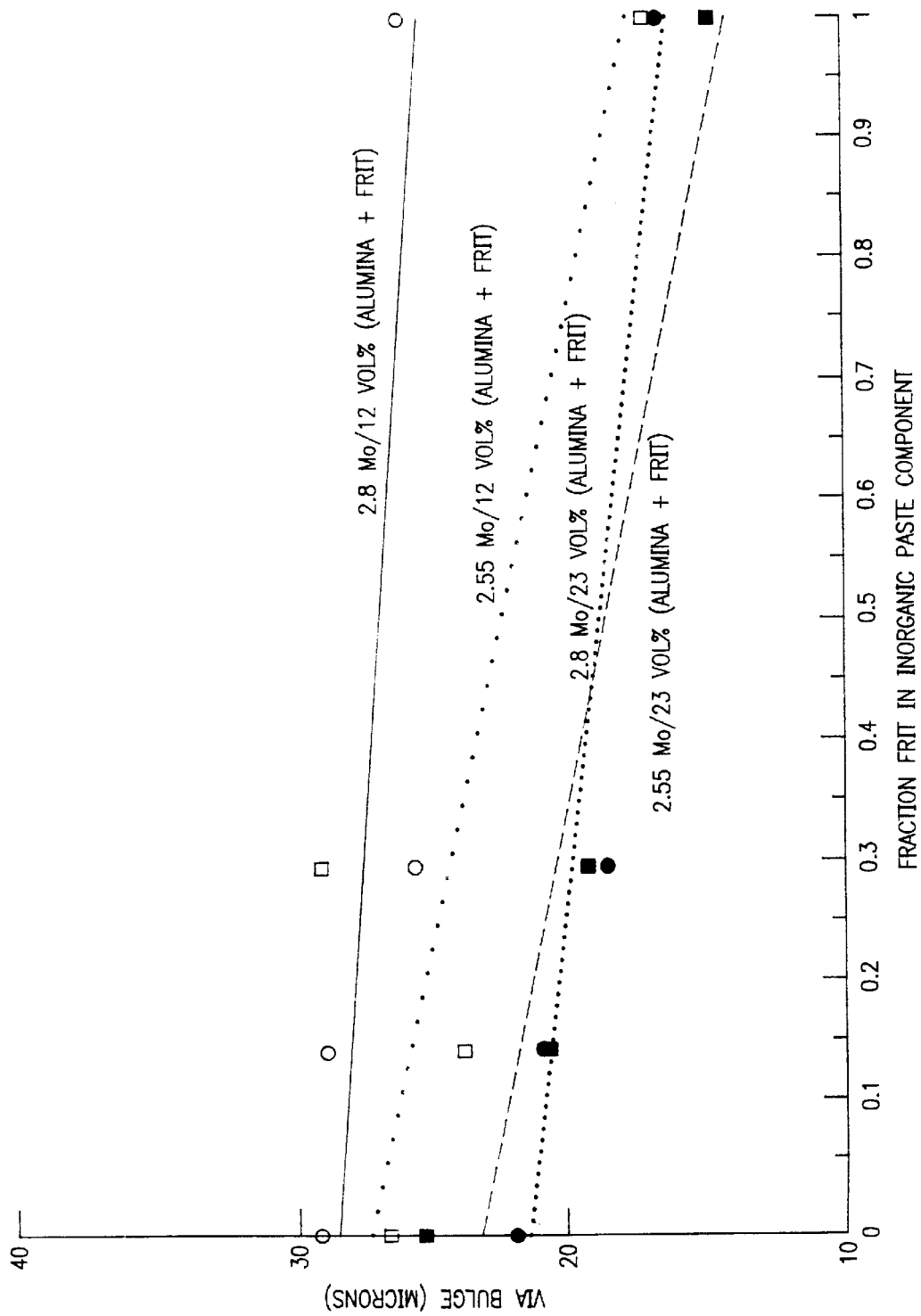
FIG. 9 is a graph of via bulge versus the fraction of frit in the paste.

The resultant via bulge is listed in FIG. 6 and also is plotted in FIG. 8 as a function of total non-metallic solids. Via bulge decreases with increasing non-metallic additive. For the data points at 12% and 23% (FIG. 8), the top two data points (largest via bulge) are for the pastes formulated with pure alumina. The lower points contain increasing amounts of frit or glass. That is, substituting glass for alumina, at a given non-metallic solids level, has the result of producing a smaller via bulge. This is shown in FIG. 9, where the data of FIG. 6 are plotted as a function of glass (frit) fraction of the non-metallic component. The data were fitted by linear regression to produce the four lines in FIG. 9.

Within the range investigated, there does not appear to be a maximum or minimum content of frit required to produce benefit. Small amounts of glass have some benefit, and more glass has an even greater benefit. All else being equal, the larger the concentration of non-metallic components in the paste, the larger the resistance of the fired line. Because higher resistance is usually not desired, it is preferred to minimize the amount of non-metallic solid additives to the paste. Thus, the reduction of the amount of via bulge and camber must be balanced with the increase in resistivity from the pastes containing glass. A preferred range for the percentage glass in the paste is about 5 to 30%. Nevertheless, a higher glass percentage may be utilized if the increase in resistivity can be tolerated.

Example 2

Additional pastes were formulated as above, but with different types and lots of Mo powder. Camber test vehicles were constructed as described above according to the geometry shown in FIGS. 2A through 2C. The ceramic green sheets were formulated in similar fashion to those used for the via test vehicles discussed above. For the several pastes for which the camber test vehicles were constructed, the data are shown in FIG. 6.

Figure 10:
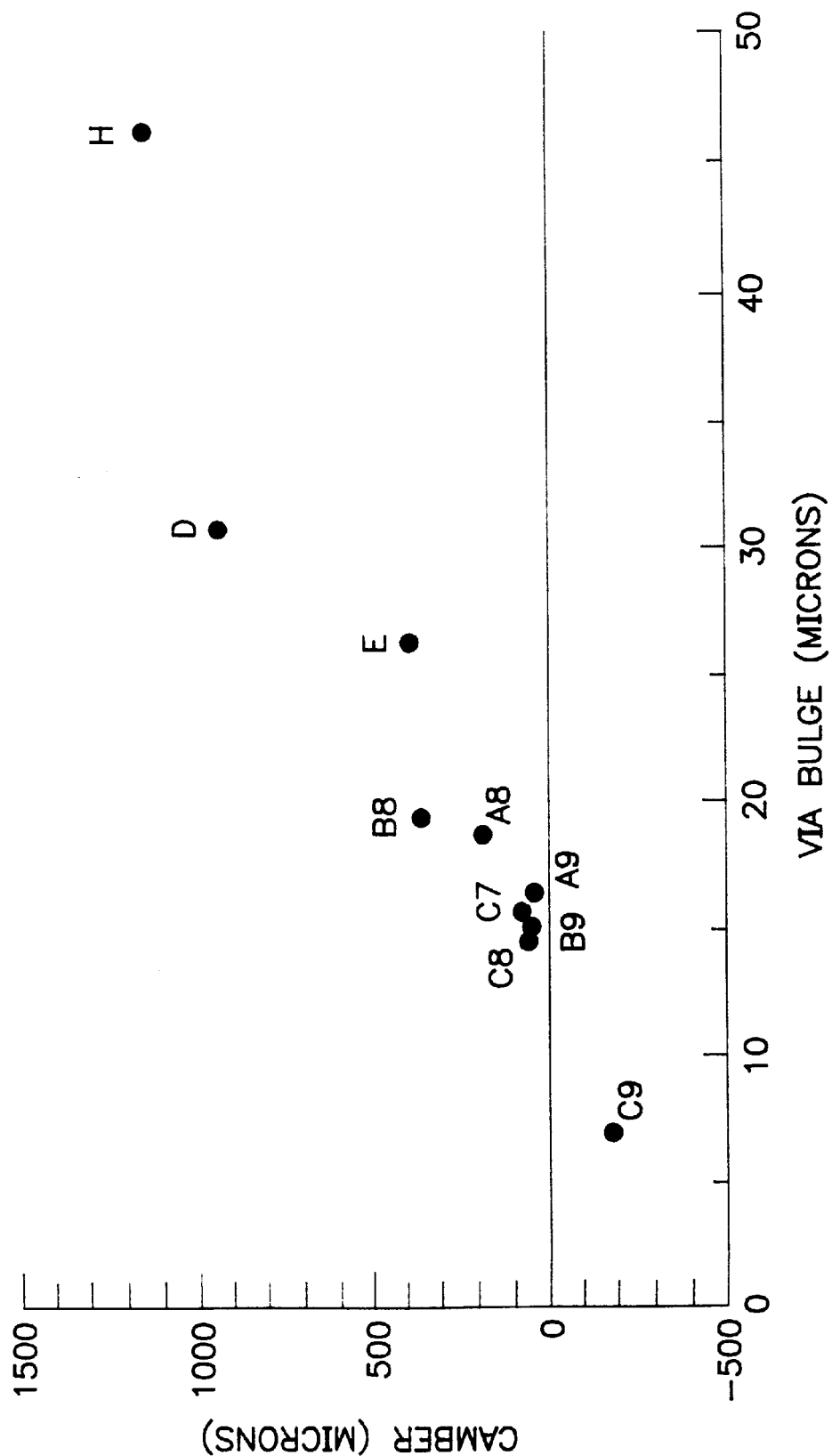
FIG. 10 is a graph of camber versus via bulge in various pastes.

FIG. 10 shows a plot of via bulge against camber, and a correlation between the two is apparent. For a given ceramic material, pastes that produce large via bulge also produce large camber, and vice versa. The reason that the plotted line does not pass through the origin of the graph is believed to be that the ceramic shrinks more in the direction perpendicular to the green sheet than it does in the plane of the green sheet. Thus, a paste that matches the shrinkage of the ceramic in the plane of the green sheet will produce no camber, but will still produce a slight amount of via bulge.

Example 3

The experiments of Examples 1 and 2 were repeated for a limited number of pastes, but the ceramic used was changed. The ceramic was again a mixture of alumina and frit, but they were in the ratio of about 91:9 instead of 85:15. The test vehicle results are listed in FIG. 7. This test demonstrates that via bulge and camber may not have the ideal trend shown for Example 2. The camber here is in the opposite direction (indicated by the negative value for camber in FIGS. 6 and 7), and the ceramic formulation of this example shrinks less than that of the ceramic in Examples 1 and 2. Nevertheless, the pastes that contain high levels of frit clearly exhibit lower via bulge and camber than the pastes containing a mixture of alumina and frit with relatively low frit contents.

Example 4

Actual substrates were prepared using the ceramic of Examples 1 and 2 and several combinations of the pastes in FIG. 6. The substrate was comprised of six layers that included both voltage plane layers and signal wiring layers. The design allowed for chip attachment by direct (C4) solder attach on the top surface, and attachment to the board was by lead frame.

Figure 11:
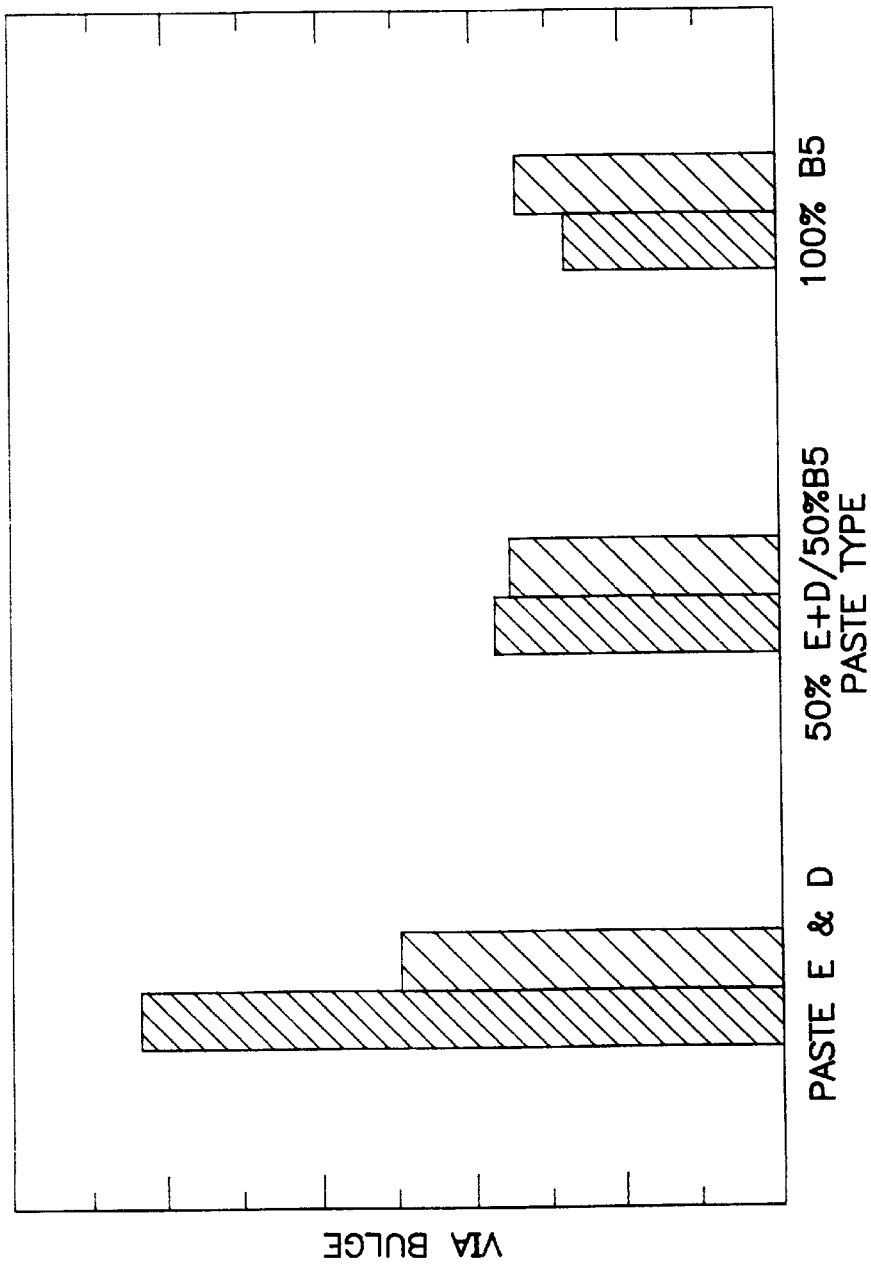
FIG. 11 is a graph of via bulge and camber with various pastes.

The first set of parts was prepared using a combination of pastes E and D on the internal layers. For the second set of parts, half of the internal layers were screened with paste B5 and the remaining half were screened with pastes E and D. As shown in FIG. 11, both via bulge and camber are reduced. For the third set of parts, all of the internal layers were screened using paste B5. These parts had the lowest camber and via bulge.

Example 5

Figure 12:
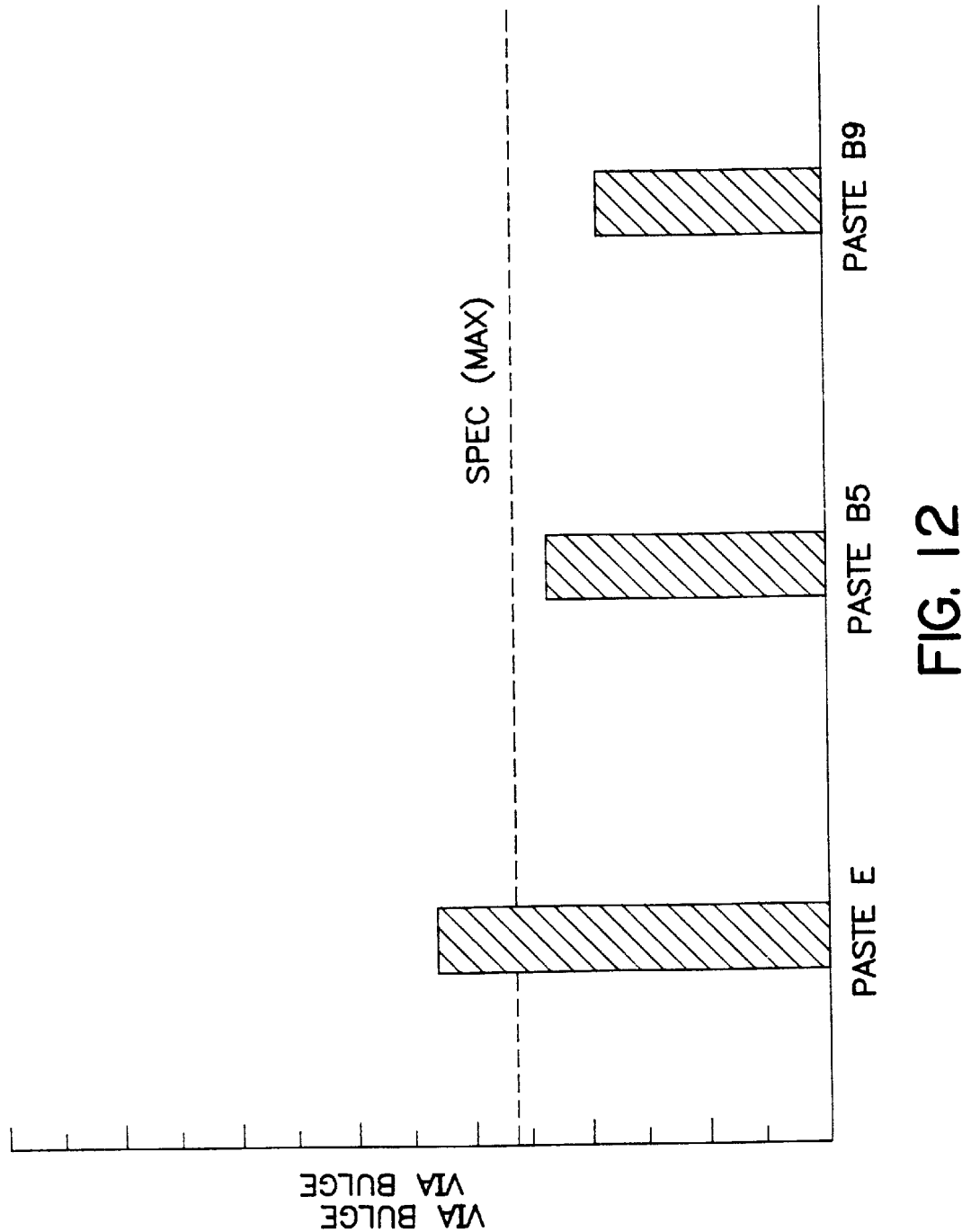
FIG. 12 is a graph of via bulge with various pastes.

A second substrate design was built using the ceramic of Examples 1 and 2 and some of the pastes listed in FIG. 6. The substrate had nineteen layers of voltage and signal wiring layers, the top layer for C4 chip solder attach and a bottom layer with pads for solder connection to the printed circuit board (PCB). Three sets of parts were constructed. The first used paste E in layers two through six (layer one is the top layer), the second used paste B5 in the same layers, and the third used paste B9 in these layers. Clearly, the via bulge is reduced for those pastes formulated with frit in the paste, with the largest via bulge reduction for the paste with the most frit. FIG. 12 shows the comparative via bulge values for pastes E, B5, and B9 used in the experiments set forth in the Examples.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A conductor paste comprising:
   a) a metal selected from the group consisting of a pure metal and a metal alloy;
   b) a nonmetallic inorganic component comprising glass frit; and
   c) an organic phase containing a binder, a solvent, and a modifier phase.

2. The paste of claim 1 wherein the non-metallic inorganic component further comprises alumina.

3. The paste of claim 1 wherein the organic phase further comprises a surfactant.

4. The paste of claim 1 wherein the non-metallic inorganic component further comprises ceramic.

5. The paste of claim 1 wherein:
   the metal is selected from the group consisting of molybdenum, tungsten, copper, nickel, silver, gold, platinum, and palladium;
   the organic binder is selected from the group consisting of ethyl cellulose, polyvinyl alcohol, and butyrol; and
   the solvent has a high boiling point and is selected from the group consisting of pine oil, terpineol, 2,2,4-trimethyl-1,3-pentanediol isobutyrate, and butyl carbitol acetate.

6. The paste of claim 5 wherein the volume percentage of solids in the paste is between about 5% and 30% glass and between about 60% and 95% metal.

7. The paste of claim 5 wherein the volume percentage of solids in the paste is between about 5% and 30% glass and between about 70% and 95% metal.

8. The paste of claim 5 wherein the volume percentage of solids in the paste is about 12% glass and about 88% metal.

9. The paste of claim 3 wherein the metal is molybdenum, the organic binder is ethyl cellulose, and the solvent is 2,2,4-trimethyl-1,3-pentanediol isobutyrate.

10. A conductor paste comprising pure molybdenum, ethyl cellulose, 2,2,4-trimethyl-1,3-pentanediol isobutyrate, and a surfactant, wherein the volume percentage of solids in the paste is about 12% glass and about 88% metal.

* * * * *